United States Patent
Tsai et al.

(10) Patent No.: US 10,510,561 B2
(45) Date of Patent: Dec. 17, 2019

(54) SEMICONDUCTOR DEVICE PACKAGE INCLUDING CONFORMAL METAL CAP CONTACTING EACH SEMICONDUCTOR DIE

(71) Applicant: Taiwan Semiconductor Manufacturing Company, Ltd., Hsin-Chu (TW)

(72) Inventors: Chen-Yu Tsai, Zhongli (TW); Tsung-Shang Wei, Baoshan Township (TW); Yu-Sheng Lin, Taichung (TW); Wen-Chih Chiou, Hsin-Chu (TW); Shin-Puu Jeng, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 78 days.

(21) Appl. No.: 15/418,065

(22) Filed: Jan. 27, 2017

(65) Prior Publication Data

US 2017/0140947 A1 May 18, 2017

Related U.S. Application Data

(62) Division of application No. 14/243,517, filed on Apr. 2, 2014, now abandoned.

(51) Int. Cl.
*H01L 21/48* (2006.01)
*H01L 21/56* (2006.01)
(Continued)

(52) U.S. Cl.
CPC .......... *H01L 21/561* (2013.01); *H01L 21/486* (2013.01); *H01L 21/4817* (2013.01);
(Continued)

(58) Field of Classification Search
None
See application file for complete search history.

(56) References Cited

U.S. PATENT DOCUMENTS 5,151,776 A 9/1992 Wojnarowski et al.
5,258,649 A 11/1993 Tanaka et al.
(Continued)

FOREIGN PATENT DOCUMENTS

KR 1020130077178 7/2013
KR 101469372 12/2014

OTHER PUBLICATIONS

Wolf, Stanley, Silicon Processing for the VLSI Era, vol. 2: Process Integration, Lattice Press, Sunset Beach, CA, 1990, pp. 127-128.
(Continued)

*Primary Examiner* — Erik Kielin
(74) *Attorney, Agent, or Firm* — Slater Matsil, LLP

(57) ABSTRACT

In accordance with an embodiment a method of manufacturing a semiconductor device includes bonding a first semiconductor die and a second semiconductor die to a first substrate, forming a conductive layer over the first semiconductor die, the second semiconductor die, and the first substrate, applying an encapsulant over the conductive layer, and removing a portion of the encapsulant, wherein the removing the portion of the encapsulant exposes the conductive layer.

20 Claims, 7 Drawing Sheets

(51) Int. Cl.
   *H01L 23/00*    (2006.01)
   *H01L 23/16*    (2006.01)
   *H01L 23/29*    (2006.01)
   *H01L 23/31*    (2006.01)
   *H01L 23/60*    (2006.01)
   *H01L 25/00*    (2006.01)
   *H01L 21/683*   (2006.01)
   *H01L 23/498*   (2006.01)
   *H01L 23/538*   (2006.01)
   *H01L 25/065*   (2006.01)

(52) U.S. Cl.
   CPC .......... *H01L 21/4853* (2013.01); *H01L 21/56* (2013.01); *H01L 21/565* (2013.01); *H01L 23/29* (2013.01); *H01L 23/3185* (2013.01); *H01L 23/3192* (2013.01); *H01L 23/49816* (2013.01); *H01L 23/49833* (2013.01); *H01L 23/5384* (2013.01); *H01L 23/5385* (2013.01); *H01L 23/60* (2013.01); *H01L 25/0655* (2013.01); *H01L 25/50* (2013.01)

(56) References Cited

U.S. PATENT DOCUMENTS

| | | |
|---|---|---|
| 5,801,452 A | 9/1998 | Farnworth et al. |
| 6,144,101 A | 11/2000 | Akram |
| 6,518,666 B1 | 2/2003 | Ikeda |
| 6,590,278 B1 | 7/2003 | Behun et al. |
| 8,362,607 B2 | 1/2013 | Scheid et al. |
| 8,643,148 B2 | 2/2014 | Lin et al. |
| 2001/0013655 A1 | 8/2001 | Smith |
| 2002/0074649 A1 | 6/2002 | Chrysler et al. |
| 2003/0168256 A1 | 11/2003 | Chien |
| 2003/0219969 A1* | 11/2003 | Saito ................ H01L 21/4857 438/622 |
| 2004/0124515 A1 | 7/2004 | Tao et al. |
| 2005/0098878 A1 | 5/2005 | Yu et al. |
| 2005/0151554 A1 | 7/2005 | Rae et al. |
| 2006/0063306 A1 | 3/2006 | Choi |
| 2008/0099909 A1 | 5/2008 | Baek et al. |
| 2008/0258133 A1 | 10/2008 | Seong |
| 2009/0072382 A1 | 3/2009 | Guzek |
| 2009/0079041 A1 | 3/2009 | Huang et al. |
| 2009/0294938 A1 | 12/2009 | Chen |
| 2010/0314743 A1 | 12/2010 | Li |
| 2011/0018114 A1 | 1/2011 | Pagaila et al. |
| 2011/0133329 A1 | 6/2011 | Takahashi |
| 2011/0278703 A1 | 11/2011 | Pagaila et al. |
| 2011/0285005 A1 | 11/2011 | Lin et al. |
| 2012/0119233 A1 | 5/2012 | Weidner et al. |
| 2012/0119346 A1 | 5/2012 | Im et al. |
| 2012/0126395 A1 | 5/2012 | Lee et al. |
| 2012/0306062 A1 | 12/2012 | Kim et al. |
| 2012/0326325 A1 | 12/2012 | Choi et al. |
| 2013/0044554 A1 | 2/2013 | Goel et al. |
| 2013/0052775 A1 | 2/2013 | Kim et al. |
| 2013/0200528 A1 | 8/2013 | Lin et al. |
| 2013/0273694 A1 | 10/2013 | Hsieh et al. |
| 2013/0277821 A1 | 10/2013 | Lundberg |
| 2013/0341786 A1 | 12/2013 | Hsu et al. |
| 2014/0017852 A1* | 1/2014 | Kwon ................ H01L 24/97 438/108 |
| 2014/0048906 A1 | 2/2014 | Shim et al. |
| 2014/0103527 A1 | 4/2014 | Marimuthu et al. |
| 2014/0138819 A1 | 5/2014 | Choi et al. |
| 2014/0210101 A1 | 7/2014 | Lin et al. |
| 2014/0252599 A1 | 9/2014 | Kwon et al. |
| 2015/0001708 A1 | 1/2015 | Lin |
| 2015/0061101 A1 | 3/2015 | Le et al. |
| 2015/0097277 A1 | 4/2015 | Chen et al. |
| 2015/0123287 A1* | 5/2015 | Hsu ................ H01L 21/02057 257/777 |
| 2015/0214133 A1 | 7/2015 | Otremba et al. |

OTHER PUBLICATIONS

Xie, J. et al., "Interposer Integration through Chip on Wafer on Substrate (CoWoS) Process," Semicon West 2012, Jul. 10-12, 2012, Altera Corporation, San Francisco, California.

\* cited by examiner

SEMICONDUCTOR DEVICE PACKAGE INCLUDING CONFORMAL METAL CAP CONTACTING EACH SEMICONDUCTOR DIE

PRIORITY CLAIM AND CROSS-REFERENCE

This application is a divisional application and claims the benefit of U.S. patent application Ser. No. 14/243,517, filed Apr. 2, 2014, entitled "Semiconductor Device and Method," which application is incorporated herein by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
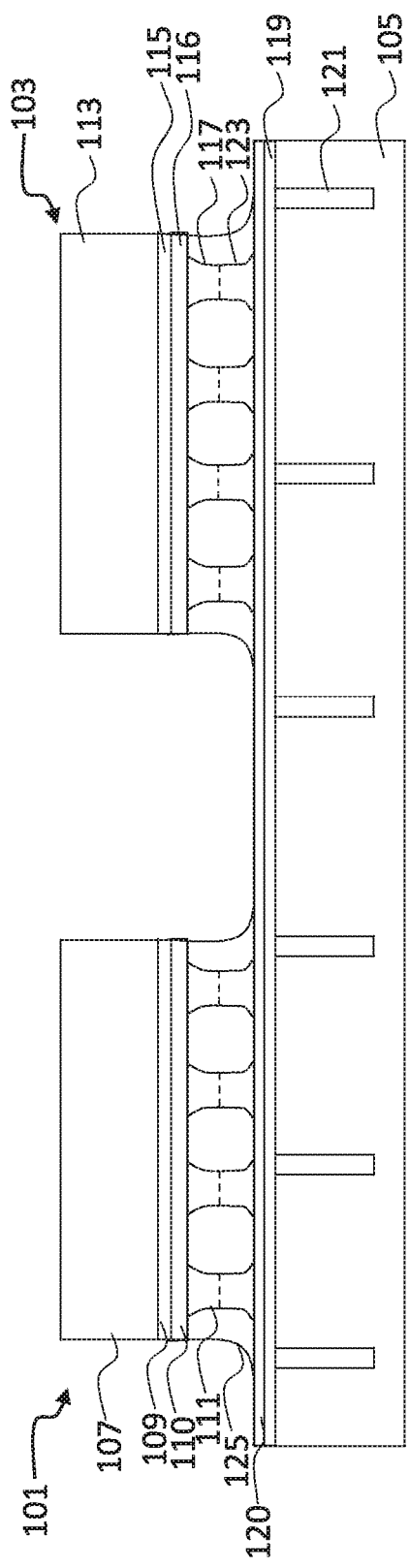
FIG. 1 illustrates a first semiconductor die and a second semiconductor die bonded to a first substrate in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference now to FIG. 1, there is illustrated a first semiconductor die 101 and a second semiconductor die 103 attached to a first substrate 105. In an embodiment the first semiconductor die 101 and the second semiconductor die 103 may be semiconductor devices such as logic dies, DRAM dies, SRAM dies, combinations of these, or the like. Additionally, while the first semiconductor die 101 and the second semiconductor die 103 may be the same type of device (e.g., both be DRAM dies), they may alternatively be different types of dies (e.g., the first semiconductor die 101 may be a logic die and the second semiconductor die 103 may be a DRAM die). The first semiconductor die 101 and the second semiconductor die 103 may also comprise a stack of multiple dies. Any suitable combination of semiconductor dies, and any number of semiconductor dies, may alternatively be utilized, and all such numbers, combinations, and functionalities are fully intended to be included within the scope of the embodiments.

The first semiconductor die 101 may comprise a second substrate 107, first active devices on the first substrate (not individually illustrated), first metallization layers (represented in FIG. 1 by the single layer labeled 109), a first passivation layer 110, and first external contacts 111 (illustrated in FIG. 1 as already bonded to third external contacts 123, discussed further below). In an embodiment the second substrate 107 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor die 101. The first active devices may be formed using any suitable methods either within or else on the second substrate 107.

The first metallization layers 109 are formed over the second substrate 107 and the first active devices and are designed to connect the various first active devices to form functional circuitry. In an embodiment the first metallization layers 109 are formed of alternating layers of dielectric and conductive material and may be formed through any suitable process (such as deposition, damascene, dual damascene, etc.). In an embodiment there may be four layers of metallization separated from the second substrate 107 by at least one interlayer dielectric layer (ILD), but the precise number of first metallization layers 109 is dependent upon the design of the first semiconductor die 101.

The first passivation layer 110 may be formed over the first metallization layers in order to provide a degree of protection for the underlying structures. The first passivation layer 110 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 110 may be formed through a process such as chemical vapor deposition (CVD), although any suitable process may be utilized, and may have a thickness between about 0.5 µm and about 5 µm, such as about 9.25 KÅ.

The first external contacts 111 may be formed through the first passivation layer 110 to provide conductive regions for contact between the first metallization layers 109 and, e.g., third external contacts 123 (illustrated in FIG. 1 as already bonded to the first external contacts 111) that are on the first substrate 105. In an embodiment the first external contacts 111 may be contact bumps such as microbumps and may comprise a material such as tin, or other suitable materials, such as silver or copper. In an embodiment in which the first external contacts 111 are tin solder bumps, the first external contacts 111 may be formed by initially forming a layer of tin through any suitable method such as evaporation, electroplating, printing, solder transfer, ball placement. Once a layer of tin has been formed on the structure, a reflow is performed in order to shape the material into the desired bump shape with a diameter of about, e.g., 20 µm, although any suitable size may alternatively be utilized.

However, as one of ordinary skill in the art will recognize, while the first external contacts have been described above as microbumps, these are merely intended to be illustrative and are not intended to limit the embodiments. Rather, any suitable type of external contacts, such as controlled collapse chip connection (C4) bumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the first external contacts 111, and all such external connectors are fully intended to be included within the scope of the embodiments.

The second semiconductor die 103 may comprise a third substrate 113, second active devices (not individually illustrated in FIG. 1), second metallization layers (represented in FIG. 1 by the single layer labeled 115), a second passivation layer 116, and second external contacts 117 (illustrated in FIG. 1 as already bonded to the third external contacts 123). In an embodiment the third substrate 113, the second active devices, the second metallization layers 115, the second passivation layer 116, and the second external contacts 117 may be similar to the second substrate 107, the first active devices, the first metallization layers 109, the first passivation layer 110, and the first external contacts 111, respectively, although they may alternatively be different materials formed from different processes. For example, the precise placement and formation of the various devices and layers will be dependent at least in part on the desired functionality of the second semiconductor die 103.

The first substrate 105 may be part of, e.g., an interposer 600 (not illustrated as complete in FIG. 1 but illustrated and described below with respect to FIG. 6) with through substrate vias (TSVs) 601 (also not illustrated in FIG. 1 but illustrated and described below with respect to FIG. 6). In this embodiment the first substrate 105 may be, e.g., a silicon substrate, doped or undoped, or an active layer of a silicon-on-insulator (SOI) substrate. However, the first substrate 105 may alternatively be a glass substrate, a ceramic substrate, a polymer substrate, or any other substrate that may provide a suitable protection and/or interconnection functionality. These and any other suitable materials may alternatively be used for the first substrate 105.

In some embodiments, the first substrate 105 may include electrical elements, such as resistors, capacitors, signal distribution circuitry, combinations of these, or the like. These electrical elements may be active, passive, or a combination thereof. In other embodiments, the first substrate 105 is free from both active and passive electrical elements therein. All such combinations are fully intended to be included within the scope of the embodiments.

Additionally, in some embodiments the first substrate 105 is a semiconductor wafer, such as a twelve inch semiconductor wafer, at this stage in the manufacturing process. For example, the first substrate 105 may extend beyond the boundaries illustrated in FIG. 1 to include additional portions that will also comprise TSVs for manufacturing additional structures. As such, when the first semiconductor die 101 and the second semiconductor die 103 are bonded to the first substrate 105 (as described further below still with respect to FIG. 1), the combined structure will be in a chip on wafer (CoW) configuration.

The TSVs 601 may be formed by initially forming TSV conductors 121 partially through the first substrate 105. The TSV conductors 121 may be formed by applying and developing a suitable photoresist to the first substrate 105 and then etching the first substrate 105 to generate TSV openings (filled later as discussed below). The openings for the TSV conductors 121 at this stage may be formed so as to extend into the first substrate 105 to a depth at least greater than the eventual desired height of the finished first substrate 105. Accordingly, while the depth is dependent upon the overall design of the interposer 600, the depth may be between about 1 µm and about 700 µm below the surface on the first substrate 105, with a depth of about 50 µm. The openings for the TSV conductors 121 may be formed to have a diameter of between about 1 µm and about 100 µm, such as about 6 µm.

Once the openings for the TSV conductors 121 have been formed, the openings for the TSV conductors 121 may be filled with, e.g., a liner (not separately illustrated in FIG. 1), a barrier layer (also not separately illustrated in FIG. 1), and a conductive material. In an embodiment the liner may be a dielectric material such as silicon nitride, silicon oxide, a dielectric polymer, combinations of these, or the like, formed by a process such as chemical vapor deposition, oxidation, physical vapor deposition, atomic layer deposition, or the like.

The barrier layer may comprise a conductive material such as titanium nitride, although other materials, such as tantalum nitride, titanium, another dielectric, or the like may alternatively be utilized. The barrier layer may be formed using a CVD process, such as PECVD. However, other alternative processes, such as sputtering or metal organic chemical vapor deposition (MOCVD), atomic layer deposition (ALD), may alternatively be used. The barrier layer may be formed so as to contour to the underlying shape of the opening for the TSV conductors 121.

The conductive material may comprise copper, although other suitable materials such as aluminum, tungsten, alloys, doped polysilicon, combinations thereof, and the like, may alternatively be utilized. The conductive material may be formed by depositing a seed layer and then electroplating copper onto the seed layer, filling and overfilling the openings for the TSV conductors 121. Once the openings for the TSV conductors 121 have been filled, excess barrier layer and excess conductive material outside of the openings for the TSV conductors 121 may be removed through a grinding process such as chemical mechanical polishing (CMP), although any suitable removal process may be used.

Once the TSV conductors 121 have been formed, a first redistribution layer 119 may be formed on a first side of the first substrate 105 in order to provide interconnectivity between the TSV conductors 121, the third external contacts 123, and the first semiconductor die 101 and the second semiconductor die 103. The first redistribution layer 119 may be formed using common methods for forming interconnect lines in integrated circuits. In an embodiment the first redistribution layer 119 comprises at least one conductive layer formed of a metal such as aluminum, copper, tungsten, titanium, and combinations thereof. The at least one conductive layer may be formed by forming a seed layer, covering the seed layer with a patterned photoresist (not illustrated), and then plating the metal on the seed layer within the openings of the photoresist. Once completed, the photoresist and portions of the seed layer underlying the photoresist are removed, leaving the at least one conductive layer, which may have a thickness of between about 2 μm and about 30 μm, with a width of about 5 μm.

As one of skill in the art will recognize, the first redistribution layer 119 could be a single layer of conductive material or else could alternatively be multiple layers of conductive material, depending upon the properties desired. For example, the first redistribution layer 119 as formed above may be plated with another conductive material such as gold or chromium to provide good adhesion for a subsequently formed connector (described below). This plating could be done through a process such as CVD.

After the first redistribution layer 119 has been formed, the third passivation layer 120 may be formed over the first redistribution layer 119, and vias may be formed through the dielectric material to provide electrical access to the first redistribution layer 119. In an embodiment the third passivation layer 120 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The third passivation layer 120 may be formed through a process such as chemical vapor deposition (CVD), although any suitable process may be utilized, and may have a thickness between about 0.5 μm and about 5 μm, such as about 9.25 KÅ.

Once the first redistribution layer 119 and the third passivation layer 120 have been formed, the third external contacts 123 may be formed in electrical connection with the first redistribution layer 119 on the first side of the first substrate 105. In an embodiment the third external contacts 123 may be similar to the first external contacts 111 and the second external contacts 117, such as by being microbumps formed using a reflow process. However, any suitable type of external contacts, and any other suitable process of formation, may alternatively be used, and all such types and processes are fully intended to be included within the scope of the embodiments.

Once ready, the first semiconductor die 101 and the second semiconductor die 103 may be bonded to the first substrate 105 using, e.g., a bonding process. In an embodiment in which the first external contacts 111, the second external contacts 117 and the third external contacts 123 are solder microbumps, the bonding process may be performed by first aligning the first external contacts 111 and the second external contacts 117 with their respective counterparts among the third external contacts 123, and then the first external contacts 111 and the second external contacts 117 are placed in physical contact with the third external contacts 123. Once in contact, a reflow process may then be performed in order to reflow the first external contacts 111, the second external contacts 117 and the third external contacts 123, thereby bonding the first external contacts 111 and the second external contacts 117 with the third external contacts 123.

Once bonded, a first underfill material 125 may be injected or otherwise formed in the space between the first semiconductor die 101, the second semiconductor die 103, and the first substrate 105. The first underfill material 125 may, for example, comprise a liquid epoxy that is dispensed between the first semiconductor die 101, the second semiconductor die 103, and the first substrate 105, and then cured to harden. This first underfill material 125 may be used to prevent cracks from being formed in the first external contacts 111, the second external contacts 117 and the third external contacts 123, wherein cracks are typically caused by thermal stresses.

Alternatively, either a deformable gel or silicon rubber could be formed between the first semiconductor die 101, the second semiconductor die 103, and the first substrate 105 in order to help prevent cracks from occurring within the first external contacts 111, the second external contacts 117 and the third external contacts 123. This gel or silicon rubber may be formed by injecting or otherwise placing the gel or rubber between the first semiconductor die 101, the second semiconductor die 103, and the first substrate 105. The deformable gel or silicon rubber may also provide stress relief during subsequent processing.

Figure 2:
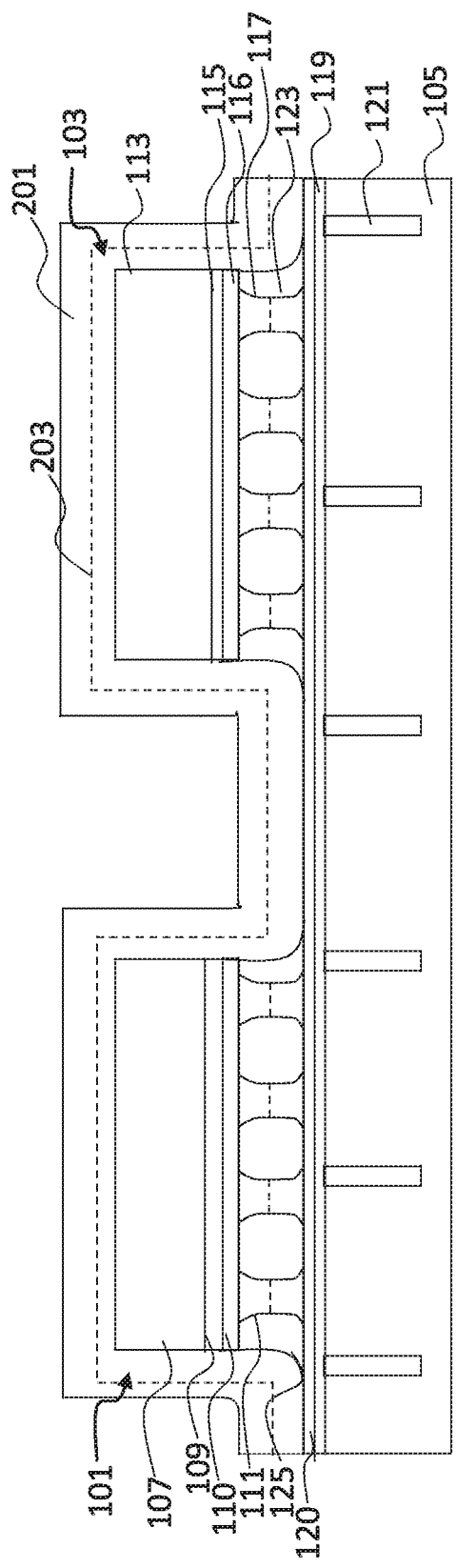
FIG. 2 illustrates a formation of a protective cap in accordance with some embodiments.

FIG. 2 illustrates a formation of a protective cap 201 over the first semiconductor die 101, over the second semiconductor die 103, and between the first semiconductor die 101 and the second semiconductor die 103, in contact with a top surface of the interposer 600 (described below with respect to FIG. 6). In an embodiment the protective cap 201 may be conductive in order to provide an equal potential across the first semiconductor die 101, the second semiconductor die 103, and the interposer 600 as well as to increase the adhesion between the first semiconductor die 101, the second semiconductor die 103, and the interposer 600. By providing an equal potential, any charge build-up that may occur during the manufacturing process (potentially destroying the first semiconductor die 101, the second semiconductor die 103, or both) may be equalized across the first semiconductor die 101, the second semiconductor die 103, and the interposer 600. This helps to reduce or eliminate damage or other deleterious effects that result from an unequal charge distribution.

In an embodiment the protective cap 201 can be a metal material such as titanium, aluminum, aluminum copper (AlCu), or the like. The protective cap 201 may be formed using a process such as physical vapor deposition, plasma enhanced physical vapor deposition, chemical vapor deposition, plasma enhanced chemical vapor deposition, atomic layer deposition, combinations of these, or the like. The protective cap 201 is also formed to thickness suitable to equalize charge. As such, any suitable thickness that allows for conduction may be utilized, although in some embodiments that thickness may be between about 500 Å and about 2000 Å. However, any suitable conductive material, such as polysilicon, and any other suitable process of formation may also be utilized.

Additionally, while the protective cap 201 is discussed above and illustrated in FIG. 2 as a single layer, this is only intended to be illustrative of embodiments and is not intended to be limiting. For example, in other embodiments the protective cap 201 may be a composite layer (represented in FIG. 2 by the dashed line labeled 203) that comprises two or more individual layers within the protective cap 201. In a particular embodiment the protective cap 201 may comprise a first layer of, e.g., titanium and a second layer of, e.g., aluminum. Any suitable combination of layers to form a composite material for the protective cap 201 may alternatively be utilized.

Figure 3:
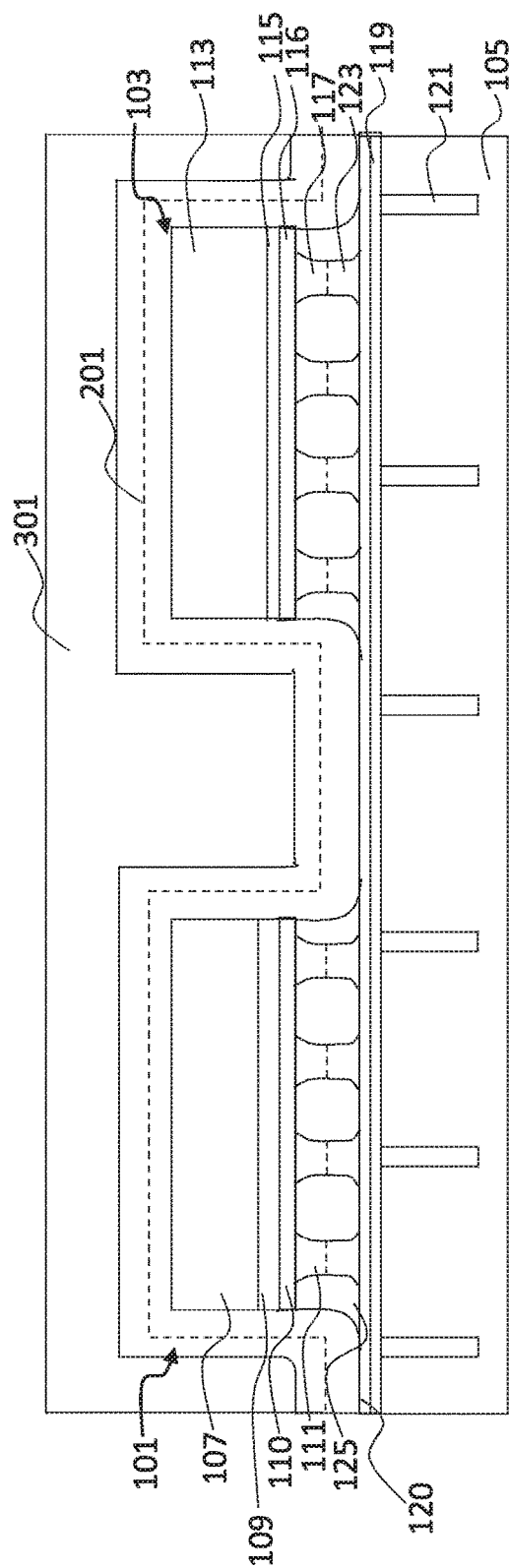
FIG. 3 illustrates a placement of an encapsulant in accordance with some embodiments.

FIG. 3 illustrates a placement of an encapsulant 301 over the first semiconductor die 101, over the second semiconductor die 103, and between the first semiconductor die 101 and the second semiconductor die 103. In an embodiment the encapsulant 301 may be molding compound, polyimide, PPS, PEEK, PES, a heat resistant crystal resin, combinations of these, or the like. In an embodiment the bonded first semiconductor die 101, second semiconductor die 103, and first substrate 105 may be placed in a molding chamber (not illustrated), and the encapsulant 301 may be injected or otherwise placed into the molding chamber. The molding chamber shapes the encapsulant 301 into the desired shape in order to encapsulate the first semiconductor die 101, second semiconductor die 103, and first substrate 105 in order to provide support and protection to the first semiconductor die 101, the second semiconductor die 103, and the first substrate 105.

Once in place, the encapsulant 301 may be cured in order to harden the encapsulant 301 for optimum protection. While the exact curing process is dependent at least in part on the particular material chosen for the encapsulant 301, in an embodiment in which molding compound is chosen as the encapsulant 301, the curing could occur through a process such as heating the encapsulant 301 to between about 100° C. and about 130° C., such as about 125° C. for about 60 sec to about 3000 sec, such as about 600 sec. Additionally, initiators and/or catalysts may be included within the encapsulant 301 to better control the curing process.

By placing the encapsulant 301 over the protective cap 201, the encapsulant 301 will not be in place during the formation of the protective cap 201. In particular, in an embodiment in which the protective cap 201 is formed using, e.g., PVD, the encapsulant 301 is not present for the process conditions during the PVD process. Because such PVD process conditions can cause outgassing of the material of the encapsulant 301 (e.g., molding compound), such outgassing and its subsequent effects on process equipment in high volume manufacturing processes may be avoided.

Figure 4:
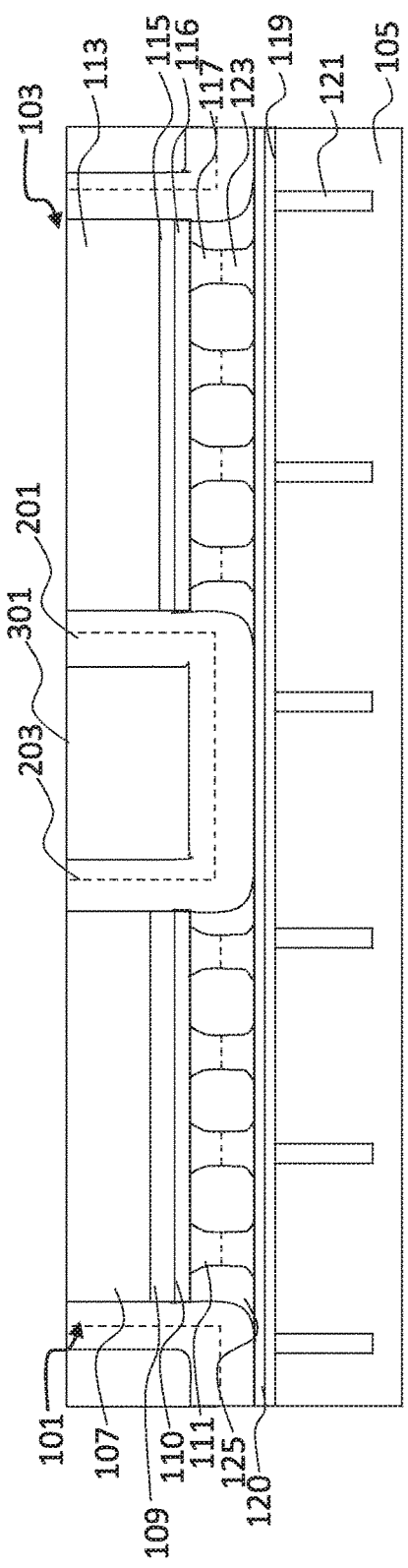
FIG. 4 illustrates a removal of a portion of the encapsulant in accordance with some embodiments.

FIG. 4 illustrates a removal of the encapsulant from surfaces of the first semiconductor die 101 and the second semiconductor die 103. In an embodiment the encapsulant may be removed or thinned, e.g., using a CMP process whereby chemical etchants and abrasives are utilized to react and grind away the encapsulant 301 until the first semiconductor die 101 and the second semiconductor die 103 have been exposed through the encapsulant 301, thereby leaving portions of the encapsulant 301 between and around the first semiconductor die 101 and the second semiconductor die 103. As such, the first semiconductor die 101 and the second semiconductor die 103 may have a planar surface that is also planar with the encapsulant 301.

Additionally, in this embodiment the CMP process, in addition to thinning and removing the encapsulant 301, will also thin and remove portions of the protective cap 201. In particular, the CMP process will remove portions of the protective cap 201 that are over the first semiconductor die 101 and the second semiconductor die 103, thereby exposing the surface of the first semiconductor die 101 and the second semiconductor die 103. As such, the first semiconductor die 101, the second semiconductor die 103, the encapsulant 301 and the protective cap 201 will all be planar with each other, and the protective cap 201 does not extend over the first semiconductor die 101 or the second semiconductor die 103.

Figure 5:
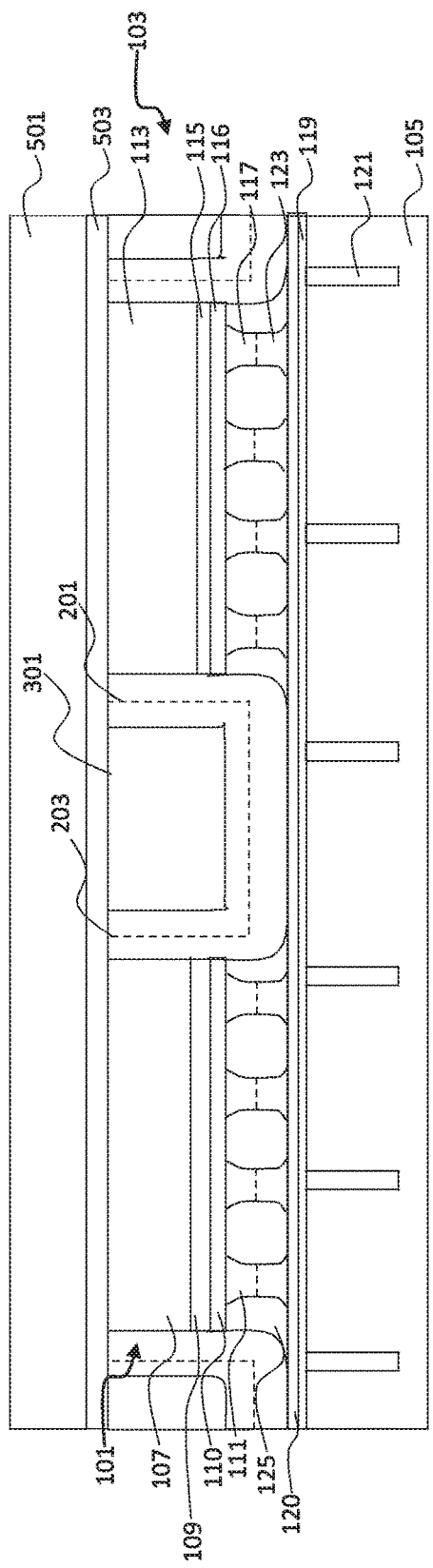
FIG. 5 illustrates an attachment of a carrier in accordance with some embodiments.

FIG. 5 illustrates an attachment of a carrier 501 to the exposed first semiconductor die 101, the second semiconductor die 103, the protective cap 201, and the encapsulant 301 using, e.g., an adhesive 503. In an embodiment the carrier 501 may comprise, for example, glass, silicon oxide, aluminum oxide, and the like. The carrier 501 may have a thickness that is greater than about 12 mils.

The adhesive 503 may be used to adhere the carrier 501 to the first semiconductor die 101 and the second semiconductor die 103. The adhesive 503 may be any suitable adhesive, such as an ultraviolet (UV) glue, which loses its adhesive property when exposed to UV lights. However, other types of adhesives, such as pressure sensitive adhesives, radiation curable adhesives, epoxies, combinations of these, or the like, may also be used. Any suitable adhesive may be utilized to adhere the carrier 501 to the first semiconductor die 101, the second semiconductor die 103, the encapsulant 301, and the protective cap 201, and all such adhesives are fully intended to be included within the scope of the embodiments.

Figure 6:
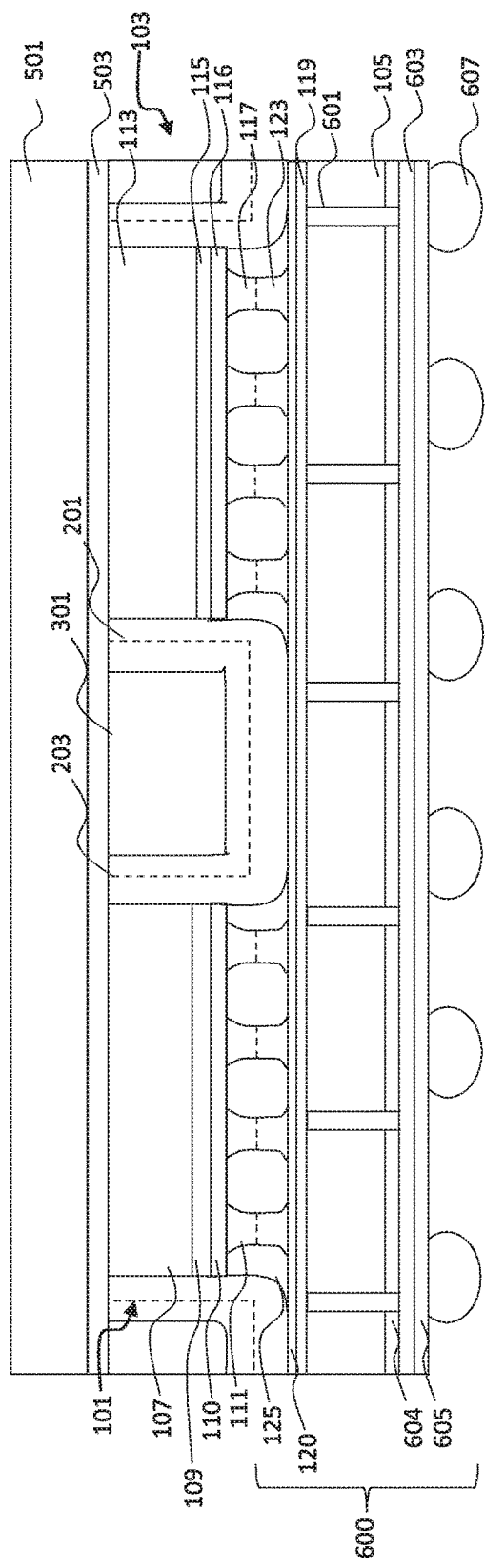
FIG. 6 illustrates a thinning of the first substrate in accordance with some embodiments.

FIG. 6 illustrates that, once the carrier 501 has been attached, the first substrate 105 may be further processed to form the interposer 600. In an embodiment the first substrate 105 is thinned in order to expose the TSV conductors 121 (see, e.g., FIG. 1) and form TSVs 601 that extend through the first substrate 105. In an embodiment, the thinning of the second side of the first substrate 105 may either leave the TSVs 601 lined by the liner or else also remove a portion of the liners in order to expose the conductive material. The thinning of the second side of the first substrate 105 may be performed by a combination of grinding, chemical mechanical polishing (CMP) and etching.

For example, a physical grinding process may be performed to initially remove a first amount of the first substrate 105. After the initial first amount has been removed, the physical grinding process may be followed by a CMP process in order to utilize a combination of chemical reactants and abrasives in order to remove an additional amount of the first substrate 105 and to expose the conductive material within the TSV conductors 121. Once a bulk of the second side of the first substrate 105 has been removed, an etching process, such as a dry etching process, may then be employed to recess the second side of the first substrate 105, if desired, and allow the TSVs 601 to protrude from the second side of the first substrate 105. In an embodiment the TSVs 601 may protrude from the second side of the first substrate 105 a distance of between about 0.5 μm and about 10 μm, such as about 5 μm.

Once the TSVs 601 protrude from the first substrate 105, a fourth passivation layer 604 may be formed in order to protect the TSVs 601. In an embodiment the fourth passivation layer 604 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The fourth passivation layer 604 may be formed through a low temperature process (in order to help avoid any outgassing of the encapsulant 301) such as low temperature chemical vapor deposition (LTCVD), and may have a thickness between about 0.5 µm and about 5 µm, such as about 9.25 KÅ. However, while a low temperature deposition process is described herein in a particular embodiment, any suitable deposition process, such as CVD, PVD, ALD, combinations of these, or the like, may alternatively be utilized.

After the fourth passivation layer 604 has been formed, the fourth passivation layer 604 may also be thinned in order to again expose the TSVs 601. In an embodiment a chemical mechanical polishing process may be used to thin the fourth passivation layer 604 until the TSVs 601 have been exposed. Optionally, after the TSVs 601 have been exposed, the fourth passivation layer 604 may be recessed using, e.g., a dry etch, so that the TSVs 601 protrude from the fourth passivation layer 604.

FIG. 6 also illustrates a formation of a second redistribution layer 603, a fifth passivation layer 605, and fourth external contacts 607. The second redistribution layer 603, similar to the first redistribution layer 119 (discussed above with respect to FIG. 1) may be formed using common methods for forming interconnect lines in integrated circuits. In an embodiment the second redistribution layer 603 comprises at least one conductive redistribution layer formed of a metal such as aluminum, copper, tungsten, titanium, and combinations thereof. The at least one conductive redistribution layer may be formed by forming a seed layer, covering the seed layer with a patterned photoresist (not illustrated), and then plating the metal on the seed layer within the openings of the photoresist. Once completed, the photoresist and portions of the seed layer underlying the photoresist are removed, leaving the at least one conductive redistribution layer, which may have a thickness of between about 2 µm and about 30 µm, with a width of about 5 µm.

Additionally, as one of skill in the art will recognize, the second redistribution layer 603 could be a single layer of conductive material or else could alternatively be multiple layers of conductive material, depending upon the properties desired. For example, the second redistribution layer 603 as formed above may be plated with another conductive material such as gold or chromium to provide good adhesion for a subsequently formed connector (described below). This plating could be done through a process such as CVD.

Once the second redistribution layer 603 has been formed, the fifth passivation layer 605 may be formed over the second redistribution layer 603. The fifth passivation layer 605 may be formed over the second redistribution layer 603, and vias may be formed through the fifth passivation layer 605 to provide electrical access to the second redistribution layer 603. In an embodiment the fifth passivation layer 605 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The fifth passivation layer 605 may be formed through a process such as low temperature chemical vapor deposition (CVD), although any other suitable process may be utilized, and may have a thickness between about 0.5 µm and about 5 µm, such as about 9.25 KÅ.

Once the second redistribution layer 603 and fifth passivation layer 605 have been formed over the second side of the first substrate 105, the fourth external contacts 607 may be formed to provide conductive regions for contact between the second redistribution layer 603 and, e.g., fifth external contacts 703 located on a second substrate 701 (not illustrated in FIG. 6 but illustrated and described further below with respect to FIG. 7) to help form the interposer 600. In an embodiment the fourth external contacts 607 may be contact bumps such as controlled collapse chip connection (C4) bumps and may comprise a material such as tin, or other suitable materials, such as silver or copper. In an embodiment in which the fourth external contacts 607 are tin solder bumps, the fourth external contacts 607 may be formed by initially forming a layer of tin through any suitable method such as evaporation, electroplating, printing, solder transfer, ball placement, etc. Once a layer of tin has been formed on the structure, a reflow is performed in order to shape the material into the desired bump shape with a diameter, e.g., of about 80 µm.

However, as one of ordinary skill in the art will recognize, while the fourth external contacts 607 have been described above as C4 bumps, these are merely intended to be illustrative and are not intended to limit the embodiments. Rather, any suitable type of external contacts, such as microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the fourth external contacts 607, and all such external connectors are fully intended to be included within the scope of the embodiments.

Figure 7:
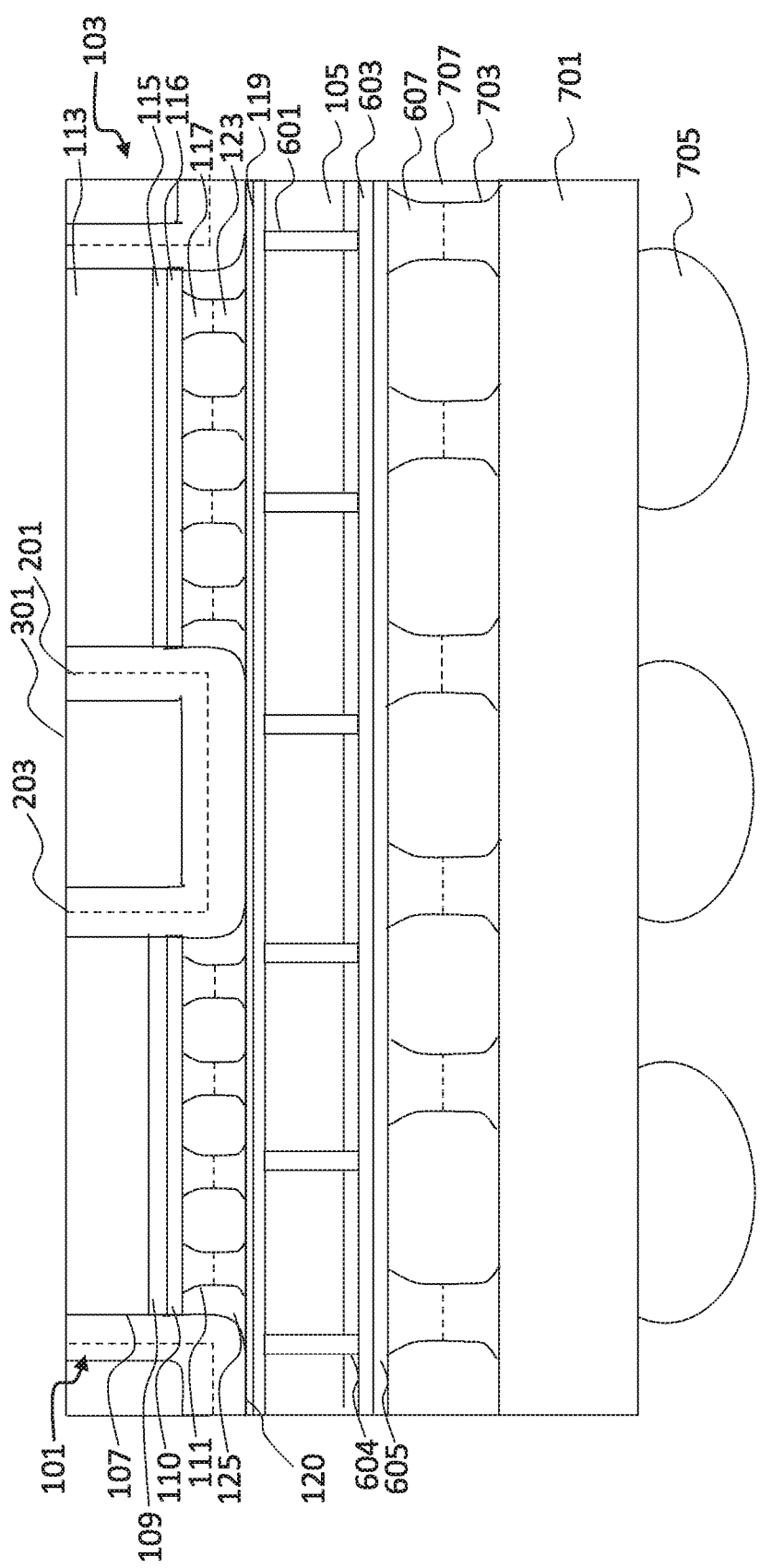
FIG. 7 illustrates a bonding of the first substrate to a second substrate in accordance with some embodiments.

FIG. 7 illustrates a second substrate 701 with fifth external contacts 703 (illustrated in FIG. 7 as already bonded to the fourth external contacts 607) on a first side of the second substrate 701 and sixth external contacts 705 on a second side of the second substrate 701. In an embodiment the second substrate 701 may be, e.g., a package substrate that works to provide electrical connectivity to, e.g., a printed circuit board (not shown) or other external devices. For example, the second substrate 701 may comprise multiple conductive layers (not individually illustrated), some of which are inter-layers within the second substrate 701. These layers may be etched into traces of various widths and lengths and connected through inter-layer vias. Together, the lines and vias may form an electrical network to route DC power, ground, and signals from one side of the second substrate 701 to the other. Those of skill in the art will recognize the second substrate 701 may be fabricated from an organic (laminate) material such as bismaleimide-triazine (BT), a polymer-based material such as liquid-crystal polymer (LCP), a ceramic material such as low-temperature co-fired ceramic (LTCC), a silicon or glass interposer, or the like. Those of skill in the art will also recognize the conductive layers and vias may be formed from any suitable conductive material, such as copper, aluminum, silver, gold, other metals, alloys, combination thereof, and/or the like, and formed by any suitable technique, such as electrochemical plating (ECP), electroless plating, other deposition methods such as sputtering, printing, and chemical vapor deposition (CVD) methods, or the like.

In some embodiments, the second substrate 701 may include electrical elements, such as resistors, capacitors, signal distribution circuitry, combinations of these, or the like. These electrical elements may be active, passive, or a combination thereof. In other embodiments, the second substrate 701 is free from both active and passive electrical elements therein. All such combinations are fully intended to be included within the scope of the embodiments.

The second substrate 701 may comprise the fifth external contacts 703 on a first side of the second substrate 701. In an embodiment the fifth external contacts 703 may be similar to the fourth external contacts 607 on the first substrate 105 (discussed above with respect to FIG. 6), such as by being C4 bumps formed using a deposition and reflow process. However, the fifth external contacts 703 may alternatively be formed using different materials and methods than the fourth external contacts 607, and all suitable methods and materials may be used for the fourth external contacts 607.

On a second side of the second substrate 701, the sixth external contacts 705 may be formed to provide additional connectivity to other devices (not individually illustrated in FIG. 7). In an embodiment the sixth external contacts 705 may comprise a ball grid array (BGA) with individual balls. In an embodiment the individual balls may comprise a material such as tin, or other suitable materials, such as silver or copper. In an embodiment the sixth external contacts 705 may be formed by initially sputter depositing a seed layer of conductive material (e.g., an underbump metallization) and then patterning a photolithographic material (not illustrated) over the seed layer of conductive material. With the photolithographic material in place and exposing portions of the seed layer, an electro-chemical plating (ECP) process may be utilized to plate the exposed portions of the seed layer within the openings of the photolithographic material. Once the plating has finished, the photolithographic material may be removed, and the portions of the seed layer that were not plated (because they were covered by the photolithographic material), are removed using, e.g. a dry etch. Once in place, a reflow is performed in order to shape the material into the desired bump shape with a diameter, e.g., of about 250 μm.

Once the fifth external contacts 703 have been formed, the second substrate 701 may be bonded to the first substrate 105 (and, as such, to the first semiconductor die 101 and the second semiconductor die 103). In an embodiment in which the first substrate 105 is a semiconductor wafer, such as in the CoW approach described above with respect to FIG. 1, the bonding process may be initiated by first debonding the first semiconductor die 101, the second semiconductor die 103, the protective cap 201, and the encapsulant 301 from the carrier 501. In an embodiment in which an ultra-violet glue is utilized as the adhesive 503, the adhesive 503 is irradiated with ultra-violet radiation until it loses some or all of its adhesiveness. Accordingly, without the adhesive 503, the first semiconductor die 101, the second semiconductor die 103, the protective cap 201, and the encapsulant 301 can easily be separated from the carrier 501.

However, as one of ordinary skill in the art will recognize, while the ultra-violet irradiation technique discussed above may be utilized when the adhesive 503 is an ultra-violet glue, other types of adhesive 503 may utilize other methods to debond the first semiconductor die 101, the second semiconductor die 103, the protective cap 201, and the encapsulant 301 from the carrier 501. For example, a thermal debonding process or a laser debonding process may be utilized, depending upon the precise adhesive 503 chosen. Any and all suitable debonding processes may be used to separate the first semiconductor die 101, the second semiconductor die 103, the protective cap 201, and the encapsulant 301 from the carrier 501, and all of these methods are fully intended to be included within the scope of the embodiments.

Once the first semiconductor die 101, the second semiconductor die 103, the protective cap 201, and the encapsulant 301 have been debonded from the carrier 501, the bonding process may be continued by next singulating a portion of the first substrate 105 bonded to the first semiconductor die 101 and the second semiconductor die 103 from the remainder of the semiconductor wafer. In an embodiment the singulation may be performed by using a saw blade (not shown) to slice the first substrate 105 within, e.g., scribe lines (e.g., regions devoid of functional circuitry) that are located between regions of the first substrate 105 that comprise functional electrical connections and/or functional circuitry. Such a slicing separates the portion of the first substrate 105 bonded to the first semiconductor die 101 and the second semiconductor die 103 from the remainder of the semiconductor wafer. Additionally, the saw blade also cuts through the encapsulant 301 located over the first substrate 105.

However, as one of ordinary skill in the art will recognize, utilizing a saw blade to singulate the first substrate 105 from the semiconductor wafer is merely one illustrative embodiment and is not intended to be limiting. Alternative methods for singulating the first substrate 105, such as utilizing one or more etches to singulate the first substrate 105 from the semiconductor wafer, may alternatively be utilized. These methods and any other suitable methods may alternatively be utilized to singulate the first substrate 105.

Once the first substrate 105 has been singulated, the bonding process may be continued by aligning the fourth external contacts 607 and the fifth external contacts 703 to each other. In an embodiment the alignment may be performed using, e.g., a pick-and-place tool to align the fourth external contacts 607 and the fifth external contacts 703 to each other. In such an embodiment a robotic tool uses, e.g., a vacuum holder in order to grab and manipulate the bonded first semiconductor die 101, second semiconductor die 103, and first substrate 105, and to then align the fourth external contacts 607 and the fifth external contacts 703.

However, while a pick-and-place tool has been described above, this description is intended to be illustrative and is not intended to be limiting upon the embodiments. Rather, any suitable method of aligning the fourth external contacts 607 and the fifth external contacts 703 may alternatively be used. All such methods are fully intended to be included within the scope of the embodiments.

Once aligned, the fourth external contacts 607 and the fifth external contacts 703 are brought into physical contact with each other. Once in physical contact, a reflow process may be performed in order to reflow the fourth external contacts 607 and the fifth external contacts 703 such that they bond together, thereby bonding the first substrate 105 to the second substrate 701.

Once bonded, a second underfill material 707 may be injected or otherwise formed in the space between the first substrate 105 and the second substrate 701. The second underfill material 707 may, for example, comprise a liquid epoxy that is dispensed between the first substrate 105 and the second substrate 701 and then cured to harden. This second underfill material 707 may be used to prevent cracks from being formed in the fourth external contacts 607 and the fifth external contacts 703, wherein cracks are typically caused by thermal stresses.

Alternatively, either a deformable gel or silicon rubber could be formed between the first substrate 105 and the second substrate 701 in order to help prevent cracks from occurring within the fourth external contacts 607 and the fifth external contacts 703. This gel or silicon rubber may be formed by injecting or otherwise placing the gel or rubber between the first substrate 105 and the second substrate 701. The deformable gel or silicon rubber may also provide stress relief during subsequent processing.

By singulating the chip on wafer structure and bonding the chip on wafer structure to the second substrate 701, a Chip on Wafer on Substrate (CoWoS) structure may be formed. However, while this embodiment has been used in the detailed description, this embodiment is intended to be illustrative and is not intended to limit the embodiments to a CoWoS structure. Rather, any suitable structure may be utilized, and all such structures are fully intended to be included within the scope of the embodiments.

By providing the protective cap 201 in contact with the first semiconductor die 101, the second semiconductor die 103, and the interposer 600, the protective cap 201 can equalize charge between the first semiconductor die 101, the second semiconductor die 103, and the interposer 600. Such an equalization allows any charge buildup that may occur during later manufacturing processes to be equalized, thereby reducing or eliminating any damage that may occur through an unequal distribution of charge. Such a reduction helps to prevent damage to the first semiconductor die 101, the second semiconductor die 103, and the interposer 600, increasing overall yield.

Figure 8:
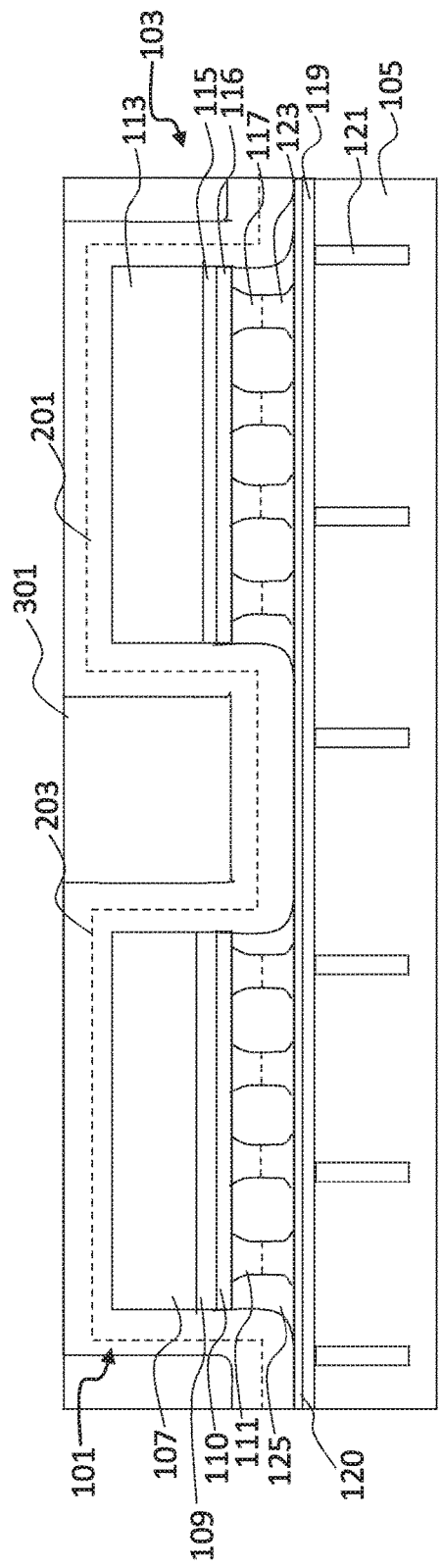
FIG. 8 illustrates a removal of encapsulant that does not remove the capping layer in accordance with an embodiment.

FIG. 8 illustrates another embodiment in which the protective cap 201 is not removed from the top surfaces of the first semiconductor die 101 and the second semiconductor die 103 during the removal of the encapsulant 301 (described above with respect to FIG. 4). In this embodiment the encapsulant 301 is still thinned and removed using a CMP process, but the process is halted or stopped after the encapsulant 301 has been removed from portions of the protective cap 201 but before the protective cap 201 has been removed from the first semiconductor die 101 and the second semiconductor die 103. As such, the protective cap 201 has a top surface over the first semiconductor die 101 and a top surface over the second semiconductor die 103, both of which are planar with the encapsulant 301.

Figure 9:
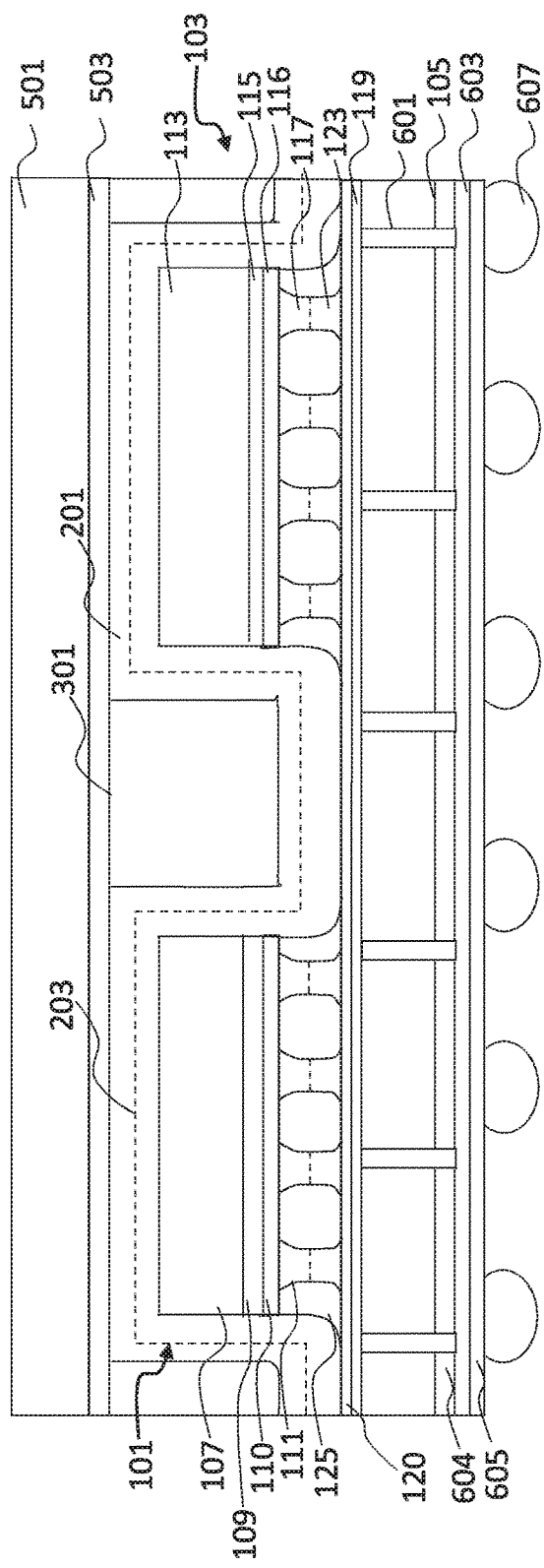
FIG. 9 illustrates an attachment of a carrier to the protective cap in accordance with some embodiments.

FIG. 9 illustrates the placement of the carrier 501 and the adhesive 503 after the encapsulant 301 has been thinned. In an embodiment the carrier 501 and adhesive 503 may be attached as described above with respect to FIG. 5. However, in this embodiment, because the protective cap 201 has not been removed by the CMP process, the adhesive 503 is placed in contact with the protective cap 201 over the first semiconductor die 101 and over the second semiconductor die 103, and is also placed in contact with the encapsulant 301.

FIG. 9 also illustrates that, once the carrier 501 and adhesive 503 have been attached to the protective cap 201 and encapsulant 301, the first substrate 105 may be thinned, and the fourth passivation layer 604, the second redistribution layer 603, the fifth passivation layer 605, and the fourth external contacts 607 may be formed on the second side of the first substrate 105. These processes may be performed as described above with respect to FIG. 6.

Figure 10:
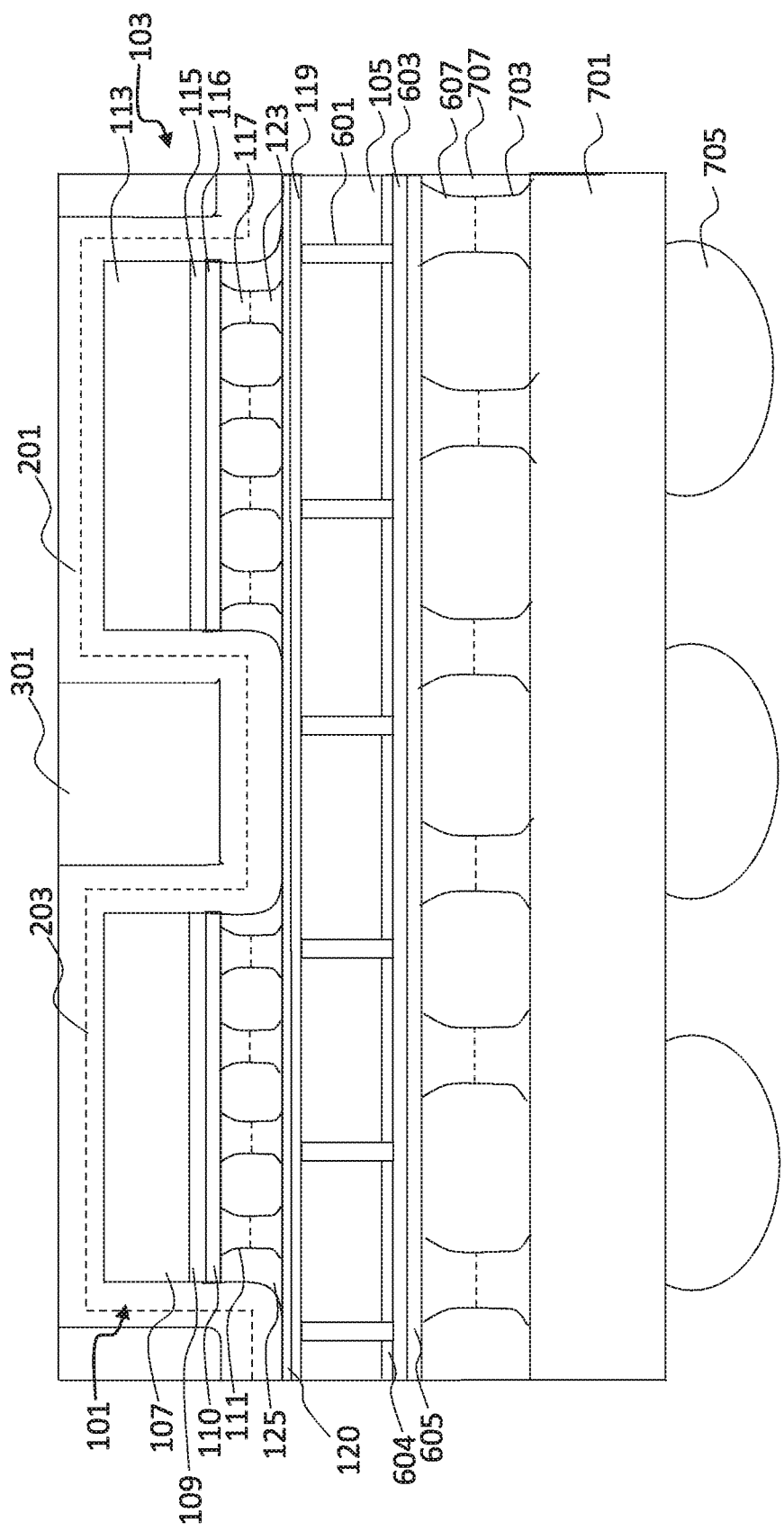
FIG. 10 illustrates a bonding of the first substrate to a second substrate in accordance with some embodiments.

FIG. 10 illustrates a bonding of the first substrate 105 to the second substrate 701 (with the fifth external contacts 703 and the sixth external contacts 705). In an embodiment the first substrate 105 may be bonded to the second substrate 701 in a similar fashion as described above with respect to FIG. 7. For example, the fifth external contacts 703 are aligned and placed in physical contact with the fourth external contacts 607 and a reflow process is performed. However, any suitable bonding process may alternatively be utilized.

By retaining the protective cap 201 over the first semiconductor die 101 and the second semiconductor die 103, and still in contact with the interposer 600, the charge distribution within the protective cap 201 can be evenly distributed, as it now includes the regions above the first semiconductor die 101 and the second semiconductor die 103. Additionally, the protective cap 201 can provide physical additional protection to the first semiconductor die 101 and the second semiconductor die 103. As such, damage from an uneven charge distribution, as well as physical damage, may be reduced or eliminated, allowing for a larger overall yield.

Figure 11:
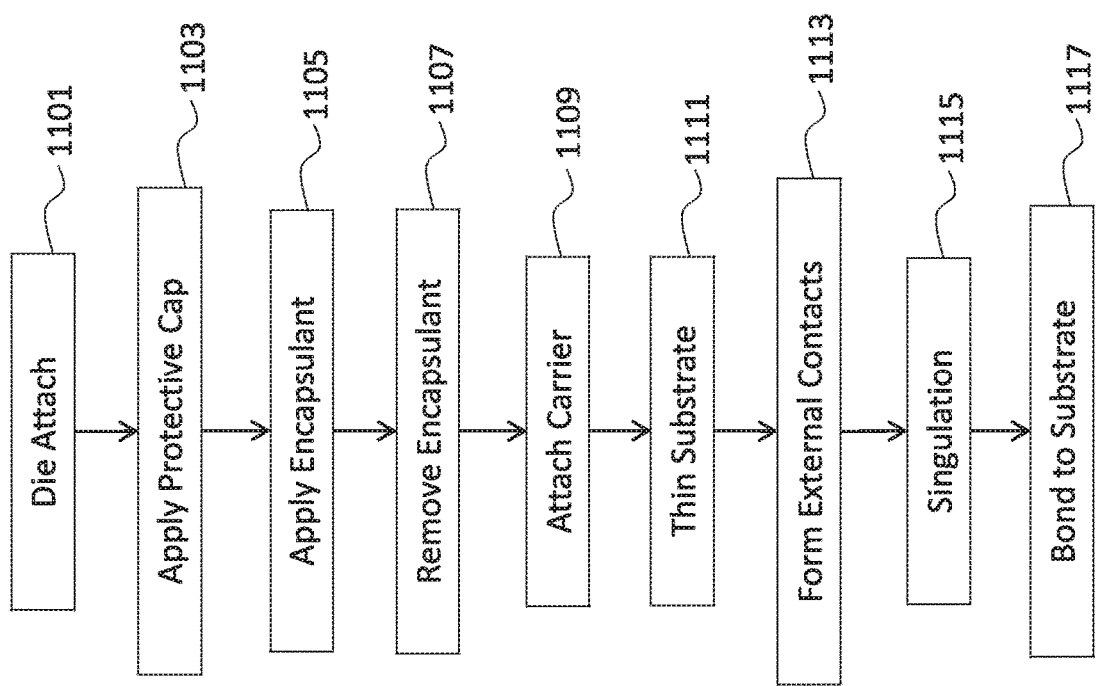
FIG. 11 illustrates a process flow chart in accordance with some embodiments.

FIG. 11 illustrates a flow chart for forming the structures described herein. In an embodiment a first step 1101 comprises attaching the first semiconductor die 101 and the second semiconductor die 103 to the first substrate 105. In a second step 1103 the protective cap 201 is applied to the first semiconductor die 101 and the second semiconductor die 103 and the first substrate 105. In a third step 1105 the encapsulant 301 is applied over the protective cap 201, the first semiconductor die 101 and the second semiconductor die 103. In a fourth step 1107 portions of the encapsulant 301 and the protective cap 201 are removed from the top surfaces of the first semiconductor die 101 and the second semiconductor die 103. Alternatively, the protective cap 201 may be left over the first semiconductor die 101 and the second semiconductor die 103.

In a fifth step 1109 a carrier 501 is attached to either the protective cap 201 or the first semiconductor die 101 and the second semiconductor die 103. In a sixth step 1111 the first substrate 105 is thinned to form the TSVs 601. In a seventh step 1113 the fourth external contacts 607 are formed on the thinned side of the first substrate 105. In an eighth step 1115 a portion of the first substrate 105 is singulated from a remainder of the semiconductor wafer. In a ninth step 1117 the singulated portion of the first substrate 105 is bonded to the second substrate 701.

By forming a semiconductor device as described, the protective cap 201 can be used to evenly distribute charges that can build up during processing. These charges, if left unchecked, may potentially damage the semiconductor device and potentially render it useless. However, by evenly distributing the charge that builds up, the damage caused by such a charge will be reduced or eliminated, leading to an overall increase in yield.

In accordance with an embodiment, a method of manufacturing a semiconductor device includes bonding a first semiconductor die and a second semiconductor die to a first substrate, forming a conductive layer over the first semiconductor die, the second semiconductor die, and the first substrate, applying an encapsulant over the conductive layer, and removing a portion of the encapsulant, wherein the removing the portion of the encapsulant exposes the conductive layer.

In accordance with another embodiment, a method includes attaching a first semiconductor device to a first substrate, the attaching including electrically coupling the first semiconductor device to the first substrate. The method also includes attaching a second semiconductor device to the first substrate, the attaching including electrically coupling the second semiconductor device to the first substrate, wherein the second semiconductor device is attached laterally adjacent the first semiconductor device. The method also includes depositing a conformal conductive layer over a top surface and a sidewall of the first semiconductor device, over a top surface and a sidewall of the second semiconductor device, and over the first substrate. The method also includes removing portions of the conformal conductive layer to expose the top surface of the first semiconductor device and removing portions of the conformal conductive layer to expose the top surface of the second semiconductor device.

In accordance with another embodiment, a method includes bonding a first semiconductor die and a second semiconductor die to a first side of a first substrate and forming a conductive layer over and contacting the first semiconductor die, the second semiconductor die, and the first substrate. The method also includes removing a first portion of the conductive layer extending over the first semiconductor die and a second portion of the conductive layer extending over the second semiconductor die. The method also includes forming through-substrate vias (TSVs) in the first substrate and bonding a second substrate to a second side of the first substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   bonding a first semiconductor die and a second semiconductor die to a first substrate;
   forming a conductive layer over the first semiconductor die, the second semiconductor die, and the first substrate;
   applying an encapsulant over the conductive layer;
   removing a portion of the encapsulant, wherein the removing the portion of the encapsulant exposes the conductive layer;
   removing a portion of the conductive layer, wherein the removing the portion of the conductive layer exposes the first semiconductor die; and
   performing a singulation process on the first substrate, a surface of the conductive layer and a surface of the encapsulant being formed by the singulation process, the surface of the conductive layer being coplanar with the surface of the encapsulant, a portion of the encapsulant extending from a first portion of the conductive layer on a first sidewall of the first semiconductor die to a second portion of the conductive layer on a second sidewall of the second semiconductor die after performing the singulation process, the first sidewall facing the second sidewall.

2. The method of claim 1, further comprising bonding the first substrate to a second substrate.

3. The method of claim 1, wherein after removing the portion of the conductive layer, a top surface of the conductive layer is level with a top surface of the first semiconductor die.

4. The method of claim 1, wherein the conductive layer physically contacts a first sidewall of the first semiconductor die and a second sidewall of the second semiconductor die.

5. The method of claim 1, wherein the forming the conductive layer forms a first layer of a first material and a second layer of a second material different from the first material.

6. The method of claim 1, wherein the conductive layer comprises aluminum.

7. The method of claim 1, further comprising thinning the first substrate to expose conductive vias.

8. A method comprising:
   attaching a first semiconductor device to a first substrate, comprising electrically coupling the first semiconductor device to the first substrate, the first semiconductor device comprising a second substrate, a front surface of the second substrate facing the first substrate;
   attaching a second semiconductor device to the first substrate, comprising electrically coupling the second semiconductor device to the first substrate, wherein the second semiconductor device is attached laterally adjacent the first semiconductor device;
   depositing a conformal conductive layer over a top surface and a sidewall of the first semiconductor device, over a top surface and a sidewall of the second semiconductor device, and over the first substrate, a first top surface of the conformal conductive layer being closer to the first substrate than the front surface of the second substrate;
   removing portions of the conformal conductive layer to expose the top surface of the first semiconductor device and removing portions of the conformal conductive layer to expose the top surface of the second semiconductor device; and
   performing a singulation process on the first substrate, wherein a portion of the conformal conductive layer extends from the sidewall of the first semiconductor device to the sidewall of the second semiconductor device after performing the singulation process.

9. The method of claim 8, further comprising:
   depositing a molding material over the conformal conductive layer; and
   removing portions of the molding material that are over the first semiconductor device and the second semiconductor device.

10. The method of claim 9, wherein a second top surface of the conformal conductive layer, a top surface of the molding material, and the top surface of the first semiconductor device are level.

11. The method of claim 8, wherein the portions of the conformal conductive layer are removed using a planarization process.

12. The method of claim 8, wherein the conformal conductive layer comprises titanium.

13. The method of claim 8, further comprising depositing an underfill material between the first semiconductor device and the first substrate.

14. The method of claim 8, wherein attaching the first semiconductor device to the first substrate comprises connecting the first substrate to the first semiconductor device using a plurality of first external connectors.

15. A method comprising:
   forming through-substrate vias (TSVs) in a first substrate;
   forming a passivation layer over a first side of the first substrate;
   bonding a first semiconductor die and a second semiconductor die to the first side of the first substrate;

forming a conductive layer over and contacting the first semiconductor die, the second semiconductor die, and the first substrate, wherein the conductive layer is in physical contact with the passivation layer, and wherein an imaginary line extending along a long axis of at least one of the TSVs intersects with an interface between the conductive layer and the passivation layer;

removing a first portion of the conductive layer extending over the first semiconductor die and a second portion of the conductive layer extending over the second semiconductor die;

performing a singulation process to singulate a portion of the first substrate from the rest of the first substrate, wherein the first semiconductor die and the second semiconductor die are bonded to the first side of the portion of the first substrate; and bonding a second substrate to a second side of the portion of the first substrate.

16. The method of claim 15, wherein the first substrate is an interposer.

17. The method of claim 15, further comprising forming first external contacts on the first side of the first substrate.

18. The method of claim 15, further comprising forming second external contacts on the second side of the first substrate.

19. The method of claim 15, further comprising forming an encapsulant over the conductive layer and around the first semiconductor die and around the second semiconductor die.

20. The method of claim 15, wherein after bonding the second substrate to the second side of the portion of the first substrate, a sidewall of the conductive layer is coplanar with a sidewall of the second substrate.

* * * * *